United States Patent [19]

Tomozane et al.

[11] Patent Number: 5,310,689
[45] Date of Patent: May 10, 1994

[54] METHOD OF FORMING A SIMOX STRUCTURE

[75] Inventors: Mamoru Tomozane; H. Ming Liaw, both of Scottsdale, Ariz.

[73] Assignee: Motorola, Inc., Schaumburg, Ill.

[21] Appl. No.: 502,885

[22] Filed: Apr. 2, 1990

[51] Int. Cl.⁵ .................... H01L 21/265; H01L 21/76
[52] U.S. Cl. ........................ 437/24; 437/62; 437/26
[58] Field of Search ............ 437/24, 62, 247; 148/DIG. 3

[56] References Cited

U.S. PATENT DOCUMENTS

| | | | |
|---|---|---|---|
| 4,863,878 | 9/1989 | Hite | 437/62 |
| 4,948,742 | 8/1990 | Nishimura | 437/24 |
| 4,975,126 | 12/1990 | Margail | 437/24 |

FOREIGN PATENT DOCUMENTS

| | | | |
|---|---|---|---|
| 0102964 | 8/1979 | Japan | 437/24 |
| 0060556 | 4/1983 | Japan | 437/24 |
| 0072533 | 3/1989 | Japan | 437/24 |

OTHER PUBLICATIONS

Mizuno et al., "Effective Removal of Oxygen from Si Layer on Buried Oxide by Implantation of Hydrogen", J. Appl. Phys. 62(6), Sep. 15, 1987, pp. 2566-2568.
Hemment et al. "Nucleation and Growth of SiO₂ Precipitates In SOI/SIMOX Related Materials". . . , Nuclear Instruments and Methods in Physics Research, B39, 1989, 210–214.
Wolf, "Silicon Processing for the VLSI Era", Lattice Press, 1986, pp. 133-136 and 305-308.

Primary Examiner—Olik Chaudhuri
Assistant Examiner—Ourmazd S. Ojan
Attorney, Agent, or Firm—Miriam Jackson

[57] ABSTRACT

A SIMOX structure having a reduced number of defects is formed by performing a two step anneal. In one embodiment, a conventional anneal is followed by an $H_2/Si$ anneal. The conventional anneal first densifies the buried oxide layer in order to make the oxide less reactive with hydrogen. The $H_2/Si$ anneal forms a quasi-equilibrium at the superficial semiconductor layer surface, thus there is no etching of the silicon surface and there is only a negligible amount of silicon deposition. The $H_2$ reacts with the oxide precipitates and dissolves them. In a second embodiment the two step anneal comprises a low temperature $H_2$ anneal followed by a conventional anneal. At low temperature, $H_2$ can diffuse through silicon, but is much less reactive. Thus, etching of the superficial silicon and silicon dioxide buried layer is minimal. The conventional anneal is at a higher temperature, thus $H_2$ can react with the oxygen precipitates to remove them.

9 Claims, 2 Drawing Sheets

METHOD OF FORMING A SIMOX STRUCTURE

BACKGROUND OF THE INVENTION

This invention relates, in general, to semiconductor processing, and more particularly, to a method of reducing oxide precipitates in a superficial layer of a SIMOX structure.

Silicon On Insulator (SOI) structures are comprised of a substrate, an insulating layer on the substrate, and a superficial semiconductor layer on the insulating layer. One way of fabricating SOI structures is by using a Separation by Implantation of Oxygen (SIMOX) technique. In this technique the insulating layer or buried oxide layer is formed by implanting a high dose of oxygen into a semiconductor substrate. The implantation causes many defects, such as oxide precipitates, to form in the bottom of the superficial semiconductor layer of the SIMOX structure. Because active devices are built in the superficial semiconductor layer, a high defect density may prohibit the use of SIMOX structures for certain devices. The rough boundary between the superficial semiconductor layer and buried oxide caused by the presence of oxygen precipitate can cause adverse device characteristics. By decreasing the density and size of the defects, the interface between the buried oxide layer and the superficial silicon layer will also be made uniform. Thus it would be desirable to reduce the number and size of defects in the superficial layer.

A reduction in the defect density has been achieved by annealing the SIMOX wafer at a high temperature of approximately 1300° to 1400° C. after oxygen implantation rather than a conventional anneal of approximately 1200°–1300° C. Although annealing at high temperatures reduces the defect density somewhat, it would be desirable to reduce the defect density even further. In addition, it would be desirable to use a lower temperature anneal due to manufacturing constraints and contamination problems at such high temperatures. The high temperature is also limited to the melting point of silicon.

Another proposed method of reducing the defect density in SIMOX wafers is by implanting hydrogen ions into a semiconductor wafer after oxygen implantation and before anneal. This method has been shown to reduce the defect density in SIMOX wafers. However, it would also be desirable to reduce the defect density without having to employ an extra implantation process.

By now it should be appreciated that it would be advantageous to provide a method of reducing the density and size of oxide precipitates in a superficial layer of a SIMOX structure.

Accordingly, it is an object of the present invention to provide a method of reducing the density and size of oxide precipitates by utilizing a two-step anneal.

Another object of the present invention is to provide a method of reducing the density and size of oxide precipitates by using a low temperature anneal.

Yet another object of the present invention is to provide a method of reducing oxide precipitates and providing a pre-clean of the superficial semiconductor layer surface.

SUMMARY OF THE INVENTION

In accordance with the present invention, the above and other objects and advantages are provided by performing a two step anneal. In one embodiment, a conventional anneal is followed by an $H_2/Si$ anneal. The conventional anneal first densifies the buried oxide layer and restores Si crystal perfection in order to make the oxide and silicon less reactive with hydrogen. The $H_2/Si$ anneal forms a quasi-equilibrium at the superficial semiconductor layer surface, thus there is no etching of the silicon surface and there is only a negligible amount of silicon deposition. The $H_2$ reacts with the oxide precipitates and dissolves them.

In a second embodiment the two step anneal comprises a low temperature $H_2$ anneal followed by a conventional anneal. At low temperature, $H_2$ can diffuse through silicon, but is much less reactive. Thus, etching of the superficial silicon and silicon dioxide buried layer is minimal. The conventional anneal is at a higher temperature, thus $H_2$ can react with the oxygen precipitates to remove them.

DETAILED DESCRIPTION OF THE DRAWINGS

Figure 1:
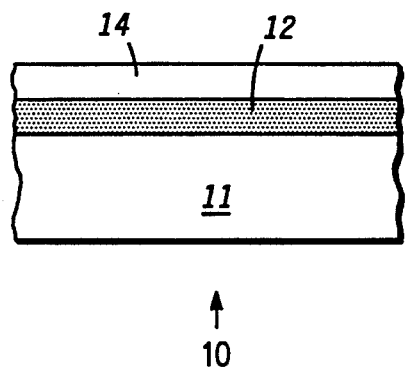
FIG. 1 illustrates a typical SIMOX structure.

FIG. 1 illustrates an enlarged, cross sectional view of a SIMOX structure 10 which is comprised of a semiconductor substrate 11, a buried oxide layer 12, and a superficial or top semiconductor layer 14. The formation of a conventional SIMOX structure 10 is well known in the art. SIMOX Structure 10 is formed by implanting oxygen ions into substrate 11, and then annealing to form buried oxide layer 12. The portion of substrate 11 remaining on top of buried oxide layer 12 is called a superficial semiconductor layer 14. An anneal is used to form buried oxide layer 12 and remove defects and oxide precipitates (not shown) from superficial semiconductor layer 14. However, after a conventional anneal, oxide precipitates are found to be remaining in superficial semiconductor layer 14. The conventional anneal is typically done at a temperature of approximately 1200°–1300° C. for approximately six hours in an argon and oxygen ambient.

Figure 2:
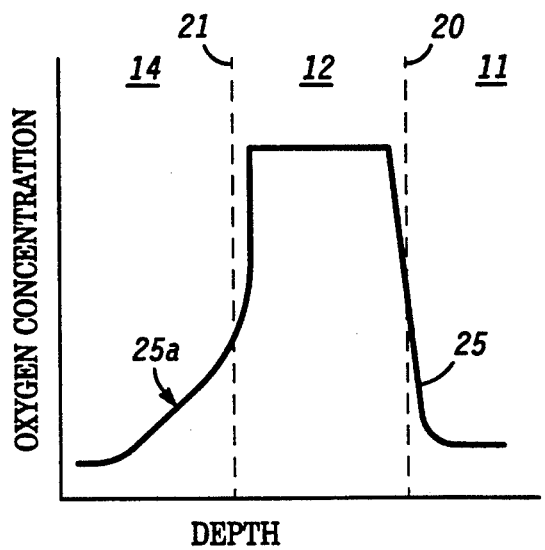
FIG. 2 illustrates a graphical representation of oxygen present in a SIMOX structure just after oxygen implantation.

FIG. 2 illustrates an approximate graphical representation of SIMOX structure 10 after oxygen implantation, but before an anneal. The abscissa shows the depth from left to right into superficial semiconductor layer 14, buried oxide layer 12, and substrate 11. Note that superficial layer 14, buried oxide layer 12, and substrate 11 have been delineated by dotted lines 20 and 21. The depth is indicated in arbitrary units for convenience. The ordinate shows the oxygen concentration in SIMOX structure 10. The oxygen concentration also is indicated in arbitrary units for convenience. Curve 25 approximately represents the oxygen concentration as a function of depth in SIMOX structure 10. The peak concentration of oxygen represents buried oxide layer 12. As can be seen by FIG. 1 after implantation, oxygen is present in superficial semiconductor layer 14 as is shown by a portion 25a of curve 25.

Figure 3:
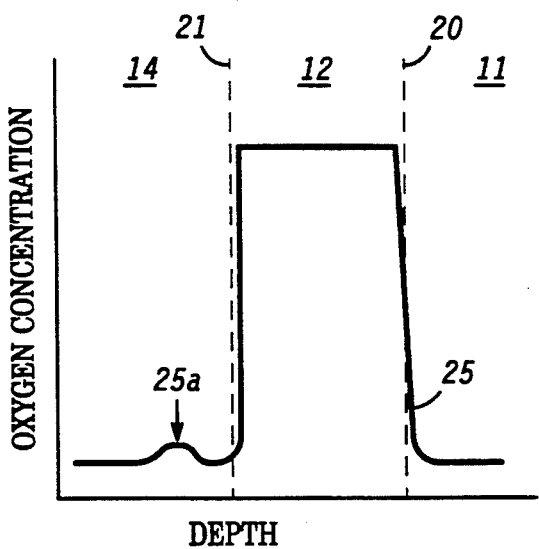
FIG. 3 illustrates a graphical representation of the presence of oxygen in a SIMOX structure after a conventional anneal.

FIG. 3 illustrates the same graphical representation as FIG. 2 after a conventional anneal. Oxygen present in superficial layer 14 has been reduced as can be seen by curve 25. However, even after this anneal, oxide precipitates are still present in the superficial semiconductor layer 14 as illustrated by portion 25a of curve 25.

Figure 4:
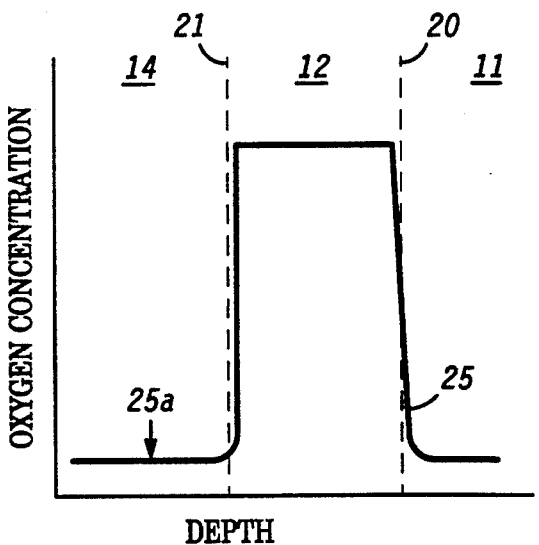
FIG. 4 illustrates a graphical representation of the presence of oxygen in a SIMOX structure after using a first embodiment of the present invention.

FIG. 4 illustrates the same graphical representation as FIG. 3 after a subsequent anneal. In order to further reduce oxide precipitates in superficial semiconductor layer 14 a further anneal is employed, at a temperature of approximately 1200° C. for approximately 30 minutes in a hydrogen and silicon ($H_2/Si$) ambient. The silicon ambient is preferably provided by a $SiCl_4$ gas. A silicon ambient can be easily provided in an epitaxial reactor. It is known that $H_2$ ambient alone at a temperature of 1200° C. will etch superficial silicon layer 14 and buried oxide layer 12. In the present invention, the $H_2/Si$ ambient establishes a quasi-equilibrium at the surface of superficial semiconductor layer 14. Thus, etching of superficial semiconductor layer 14 is prevented and deposition of silicon is negligible. The use of silicon in combination with hydrogen allows the use of hydrogen to remove oxide precipitates without etching superficial semiconductor layer 14 as in the prior art. In one embodiment, a temperature of approximately 1200° C. is used. However, higher temperatures may be used, which may further reduce the number of oxide precipitates. The $H_2/Si$ anneal must be done after a conventional anneal. The conventional anneal densifies buried oxide layer 12, thus making the silicon dioxide less reactive with hydrogen. A higher temperature may be used in the conventional anneal, but this is not preferable. In addition, the $H_2/Si$ ambient provides for a precleaning of the surface of superficial layer 14. In the prior art, a preclean was not possible because the superficial semiconductor layer 14 was not thick enough to stand up to the $H_2/HCl$ etches. It is desirable to have a clean surface in order to grow high quality epitaxial layers on the surface of superficial semiconductor layer 14.

Figure 5:
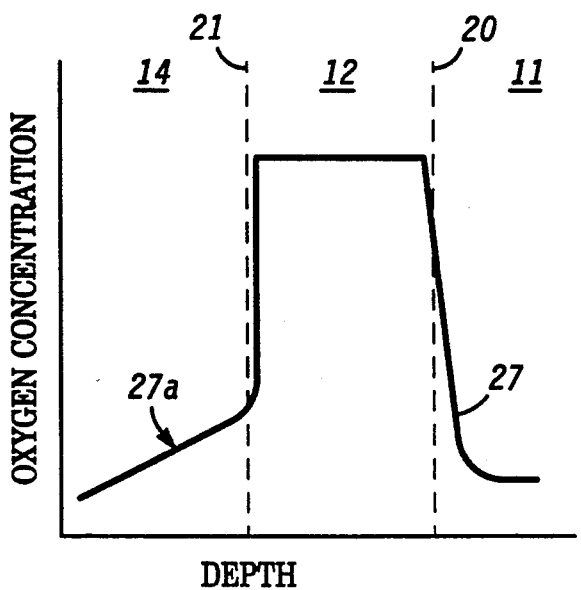
FIGS. 5-6 illustrate graphical respresentations of oxygen present in a SIMOX structure at various steps of using a further embodiment of the present invention.

FIG. 5 illustrates a graphical representation of SIMOX structure 10 after oxygen implantation and a low temperature $H_2$ anneal, according to a second embodiment of the present invention. The same numerals are used to represent semiconductor substrate 11, buried oxide layer 12, and superficial semiconductor layer 14. This anneal is preferably done at a temperature of approximately 700° to 900° C. for approximately 2-16 hours, and more preferably at approximately 850° C. for approximately 16 hours. A portion 27a of curve 27 shows that oxide precipitates have not been substantially reduced after this anneal. This process step, however, is believed to introduce $H_2$ into the structure 10. At this low temperature $H_2$ can still diffuse through silicon, but is not reactive enough to etch silicon or silicon dioxide, thus superficial semiconductor layer 14 and buried oxide layer 12 are not etched.

Figure 6:
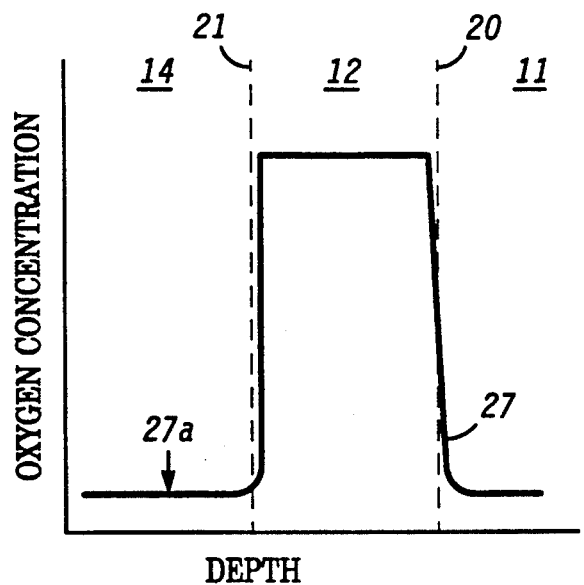

FIG. 6 illustrates the same graphical representation as FIG. 5 after a conventional anneal of $H_2$ pre-annealed SIMOX. The temperature of $H_2$ anneal is not high enough to provide adequate annealing of buried oxide layer 12. During this conventional anneal, the oxide precipitates in superficial layer 14 are reduced by the $H_2$ introduced previously as is shown by portion 27a of curve 27. A conventional anneal has been described with reference to FIG. 1. In this embodiment, high temperature annealing over 1300° C. is not required to reduce the density and size of oxide precipitates. By reducing the number of oxide precipitates and decreasing their size, the formation of further defects propagating from the oxide precipitates is prevented.

By now it should be appreciated that a method of reducing the presence and size of oxide precipitates in a superficial semiconductor layer of a SIMOX structure has been disclosed. By utilizing the present invention, it is not necessary to go to temperatures above 1300° C.

We claim:

1. A method of reducing defects in a SIMOX structure, comprising the steps of:
   annealing the SIMOX structure in a first ambient comprised of hydrogen; and
   annealing the SIMOX structure in a second ambient comprised of an inert gas at a temperature of approximately 1200° to 1300 ° C.

2. The method of claim 1 wherein the first ambient also includes a silicon compound, and wherein a quasi-equilibrium is established, wherein etching of the SIMOX structure is prevented and deposition of silicon is negligible.

3. The method of claim 1 wherein annealing the SIMOX structure in a first ambient is done at a low temperature of approximately 700°-900° C.

4. A method of forming a SIMOX structure, comprising the steps of:
   providing a semiconductor substrate;
   implanting oxygen into the substrate;
   annealing the substrate in a first ambient comprised of argon and oxygen, thus forming a buried oxide layer and a superficial layer having a surface; and
   annealing the substrate in a second ambient comprised of hydrogen and a silicon compound, wherein a quasi-equilibrium is established at the surface of the superficial layer, wherein etching of the superficial layer is prevented and deposition of silicon is negligible.

5. A method of reducing defects in a SIMOX structure, comprising the steps of:
   providing the SIMOX structure;
   annealing the SIMOX structure in a first ambient comprised of argon and oxygen; and
   annealing the SIMOX structure in a second ambient comprised of hydrogen and a silicon compound, wherein a quasi-equilibrium is established, wherein etching of the SIMOX structure is prevented and deposition of silicon is negligible.

6. The method of claim 5 wherein the annealing in the second ambient is done at a temperature of approximately 1200° C.

7. The method of claim 6 wherein the annealing in the second ambient is done for approximately 30 minutes.

8. A method of forming a SIMOX structure, comprising the steps of:
   providing a silicon substrate;
   forming a buried oxide layer in the substrate by ion implantation of oxygen, thus forming the SIMOX structure;
   annealing the SIMOX structure such that the buried oxide layer is densified; and
   annealing the SIMOX structure in an ambient comprised of hydrogen and a silicon compound, wherein a quasi-equilibrium is established, wherein deposition of silicon is negligible.

9. A method of reducing defects in a SIMOX structure, comprising the steps of:

providing a SIMOX structure;
annealing the SIMOX structure in a first ambient comprised of hydrogen at a low temperature of approximately 700-900° C.; and
annealing the SIMOX structure in a second ambient comprised of argon and oxygen at a temperature of approximately 100° to 1300° C.

* * * * *